United States Patent
Manger et al.

(10) Patent No.: US 7,825,031 B2
(45) Date of Patent: Nov. 2, 2010

(54) METHOD OF FABRICATING A SEMICONDUCTOR DEVICE

(75) Inventors: Dirk Manger, Dresden (DE); Rolf Weis, Dresden (DE); Christoph Noelscher, Nuremberg (DE)

(73) Assignee: Qimonda AG, Munich (DE)

( * ) Notice: Subject to any disclaimer, the term of this patent is extended or adjusted under 35 U.S.C. 154(b) by 245 days.

(21) Appl. No.: 11/855,809

(22) Filed: Sep. 14, 2007

(65) Prior Publication Data
US 2009/0075462 A1 Mar. 19, 2009

(51) Int. Cl.
*H01L 21/302* (2006.01)
(52) U.S. Cl. .................. 438/705; 438/42; 438/700; 257/E21.039
(58) Field of Classification Search ............. 438/39–40, 438/42–43, 443–445, 447, 700–703, 705; 257/E21.039
See application file for complete search history.

(56) References Cited

U.S. PATENT DOCUMENTS

| 7,179,748 | B1 * | 2/2007 | Lee et al. ................. 438/703 |
| 2006/0166419 | A1 * | 7/2006 | Shimoyama et al. ........ 438/173 |

OTHER PUBLICATIONS

Ogryzlo, E.A., et al., "Doping and crystallographic effects in Cl-atom etching of silicon," Journal of Applied Physics, Mar. 15, 1990, pp. 3115-3120, vol. 67, Issue 6, American Institute of Physics.

* cited by examiner

*Primary Examiner*—Thanhha Pham

(57) ABSTRACT

The invention relates to a method of fabricating an integrated circuit, including the steps of providing at least one layer; performing a first implantation step, wherein particles are implanted into the layer under a first direction of incidence; performing a second implantation step, wherein particles are implanted into the layer under a second direction of incidence which is different from the first direction of incidence; performing a removal step, wherein the layer is partially removed depending on the local implant dose generated by the first and the second implantation step.

30 Claims, 15 Drawing Sheets

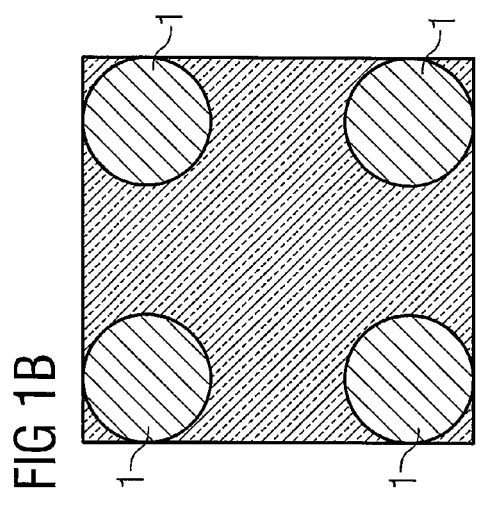
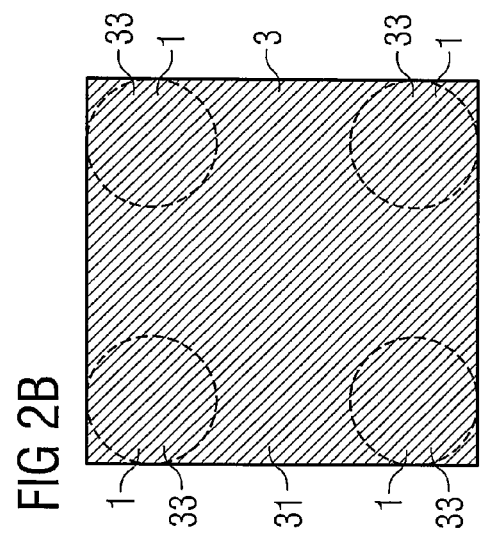
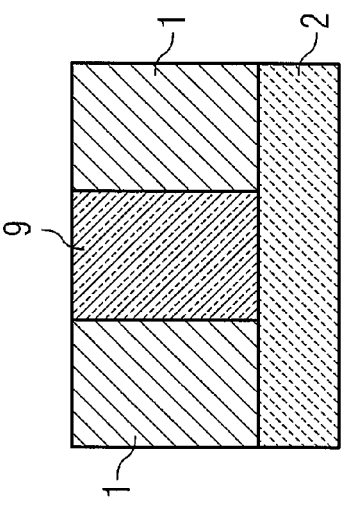
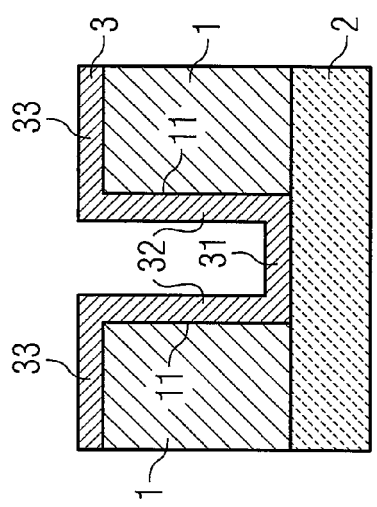

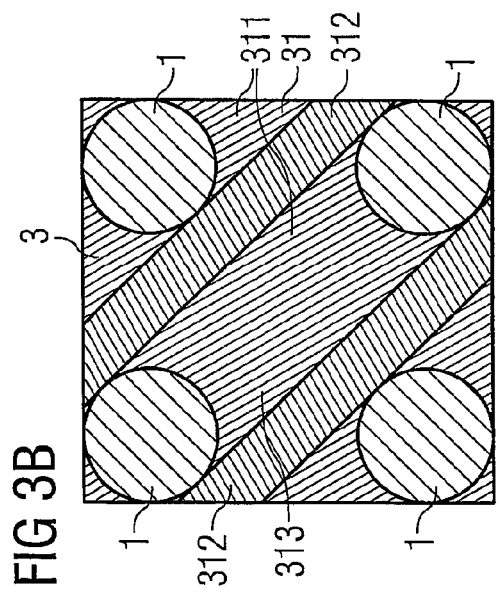
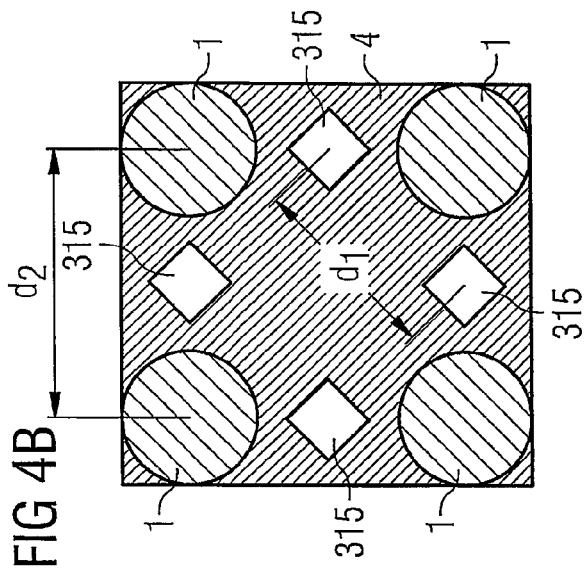
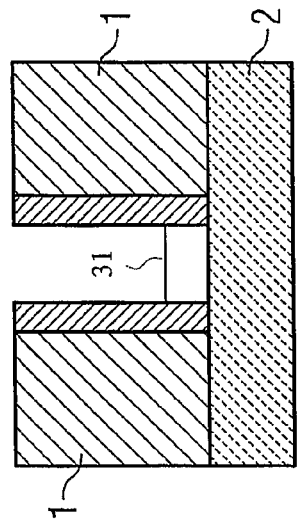
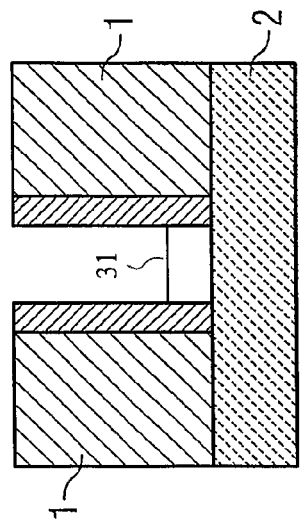

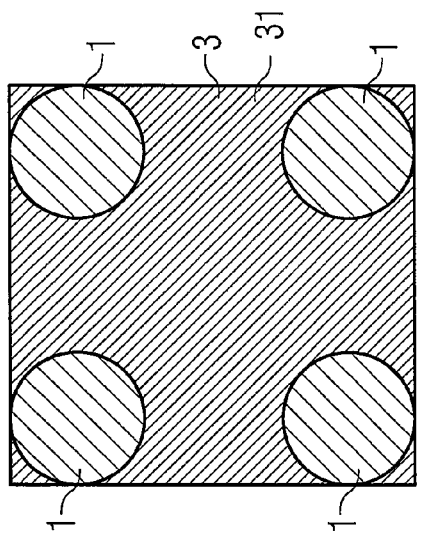
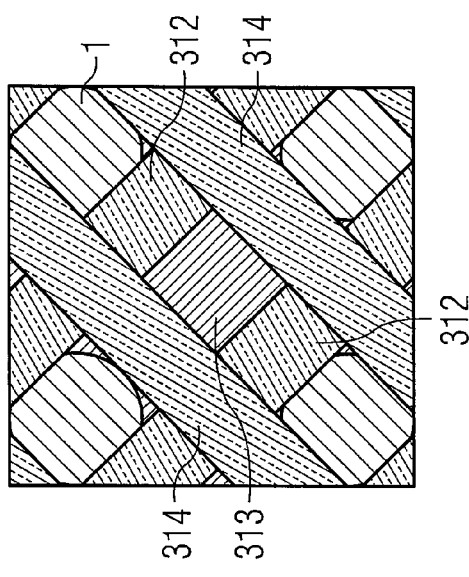
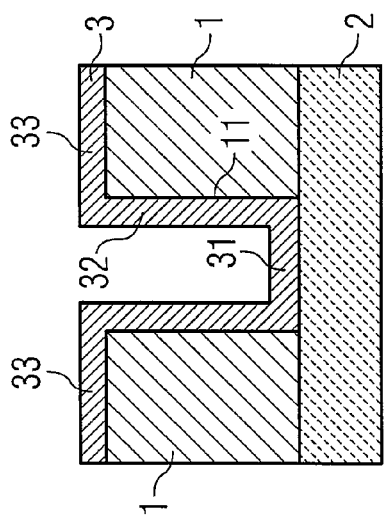
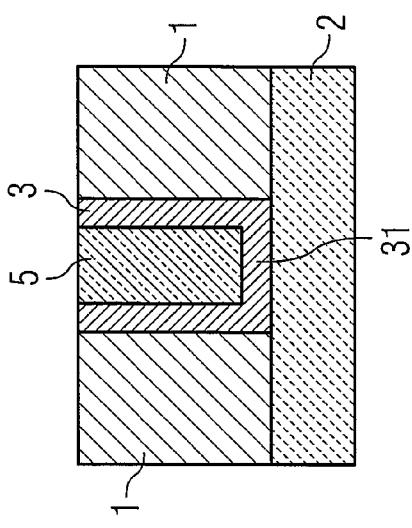

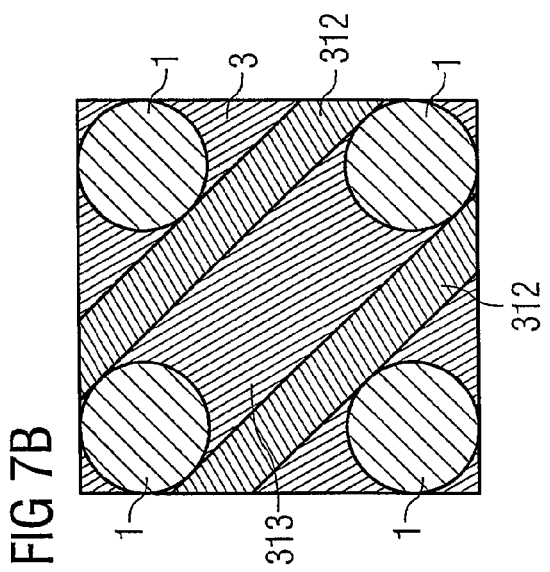
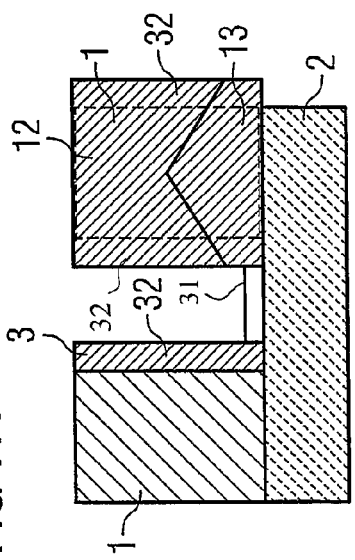
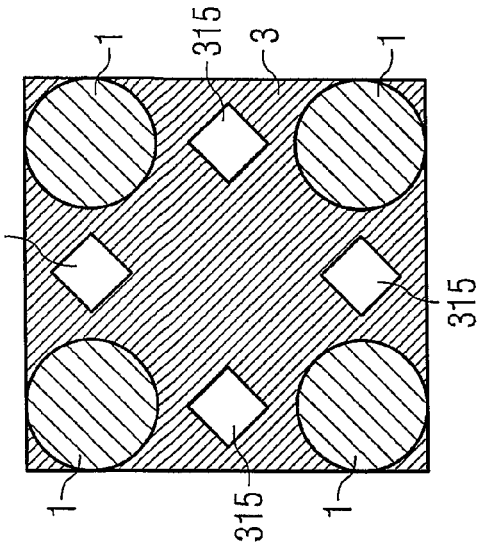
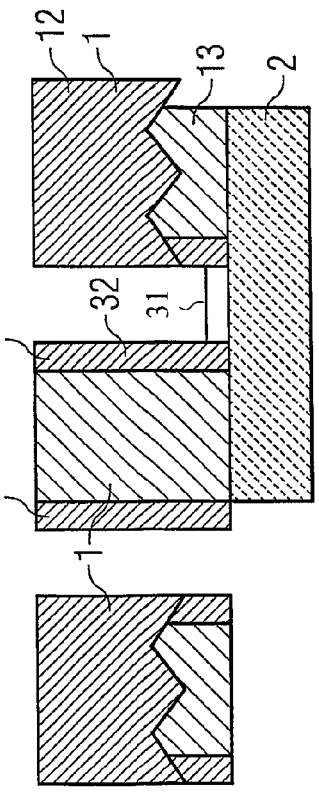

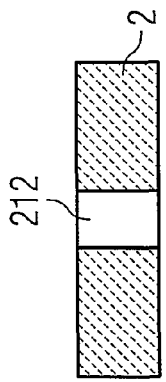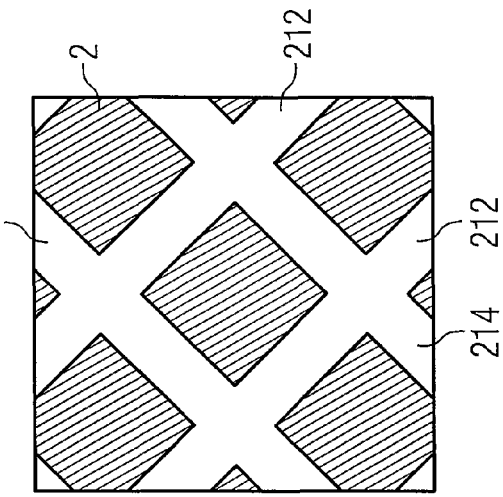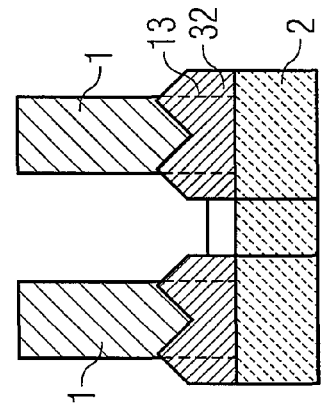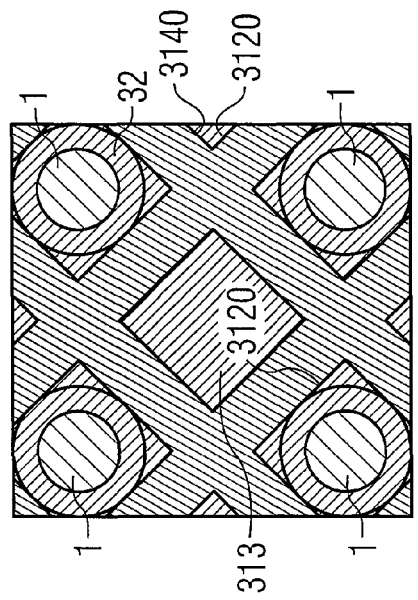

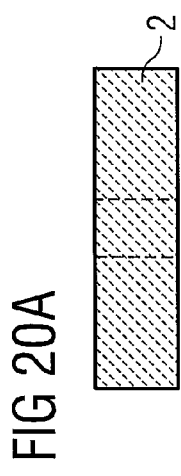
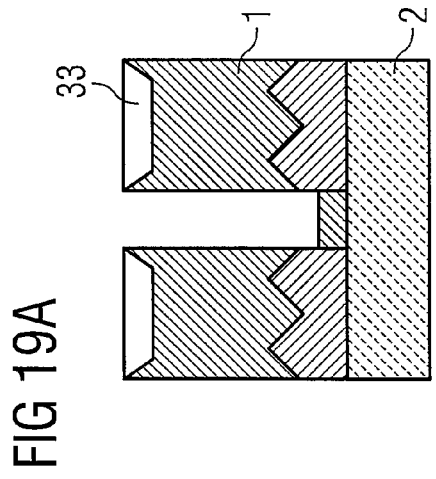
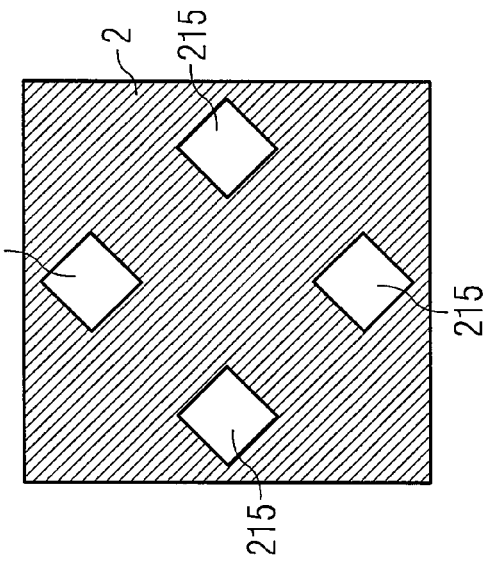
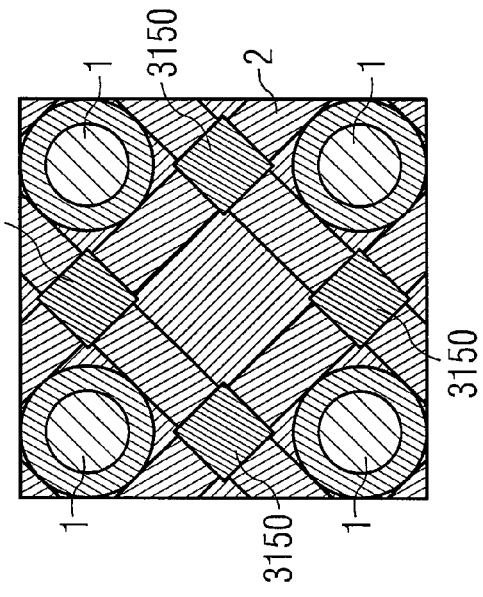

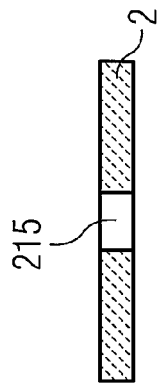
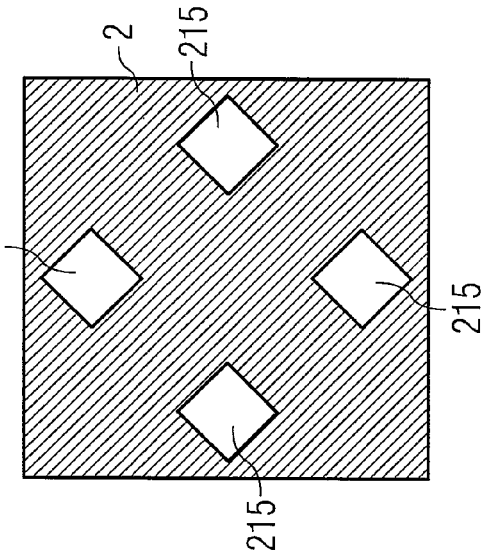
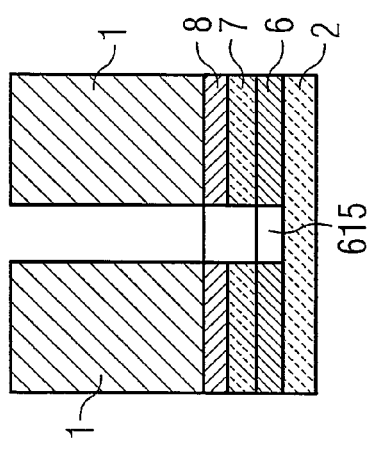
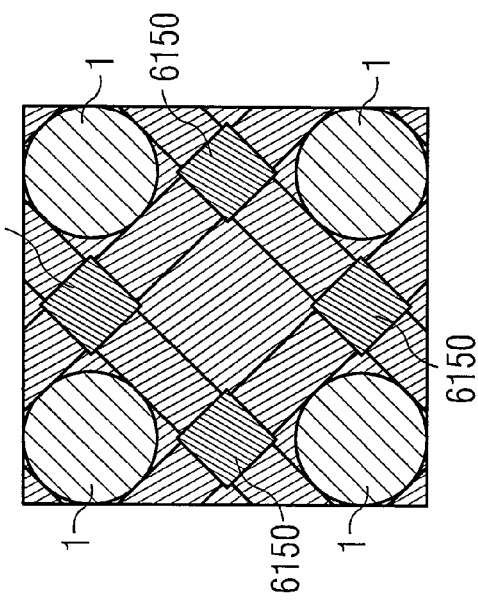

METHOD OF FABRICATING A SEMICONDUCTOR DEVICE

BRIEF DESCRIPTION OF THE DRAWINGS

In the accompanying drawings:

FIGS. 1A-4B illustrate process steps of a method according to a first embodiment of the invention;

FIGS. 5A-6B illustrate process steps of a method according to a second embodiment of the invention;

FIGS. 7A-8B illustrate an implant distribution in stud structures on a substrate;

FIGS. 9A-12B illustrate process steps of a method according to a third embodiment of the invention;

FIGS. 17A-20B illustrate process steps of a method according to a fifth embodiment of the invention;

FIGS. 23A-26B illustrate process steps of a method according to a sixth embodiment of the invention;

DETAILED DESCRIPTION OF ILLUSTRATIVE EMBODIMENTS

Figure 9A:
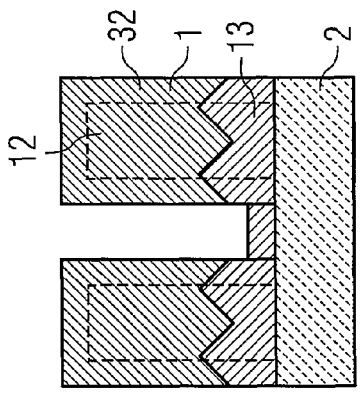

FIGS. 1A, 2A, 3A and 4A depict cross sectional views of a structure during different process steps of a method according to a first embodiment of the invention. FIGS. 1B, 2B, 3B and 4B depict top views of the structure.

FIGS. 1A and 1B show a plurality of structures in the form of cylindrical studs 1. The studs 1 are arranged on a substrate, more particularly on a hard mask layer 2 which in turn is deposited on a substrate. Hard mask layer 2 can be, e.g., formed of amorphous silicon. However, other materials can be used for forming layer 2.

Further, a skilled person acknowledges that there are different possible methods of forming studs 1. One possibility is a damascene process in silicon nitride, wherein the studs are formed of silicon oxide, for example. In a damascene process in silicon nitride recesses in a silicon nitride layer are filled with a different material for forming the studs (e.g., silicon oxide as mentioned above). This situation is shown in FIG. 1A which illustrates that studs 1 are formed in recesses of a silicon nitride layer 9. Subsequently, the silicon nitride is removed such that a plurality of spaced studs 1 are generated. However, as mentioned above, other methods of fabricating a pattern of studs can be applied, e.g., direct structuring of a stud material layer.

In this embodiment the studs 1 are arranged in a regular pattern on layer 2. More particularly, the studs are equally spaced in a pattern of several parallel columns and rows. In that respect a "column" or a "row" refers to a column or row of studs in which two neighboring studs have the smallest possible distance from each other. Referring to FIG. 1B, for example, a column is formed by the studs which are arranged vertically and a row is formed by the horizontally arranged columns. However, the column and row like stud arrangement of the first embodiment is only exemplary and the invention comprises other stud layouts such as e.g. non-regular layouts or column-row layouts with different spaces between rows and columns or two or more different and alternating spaces between the columns and rows, respectively.

Referring to FIGS. 2A and 2B, after formation of the studs 1 a layer 3 (e.g., of aluminum oxide—$Al_2O_3$) is deposited conformally such that the studs 1, more particularly sidewalls 11 of the studs 1 and a top portion of the studs, as well as a region between the studs 1 are covered by layer 3. The deposition of layer 3 can be performed by, e.g., chemical vapor deposition (CVD) or atomic layer deposition (ALD), e.g., followed by an annealing step. For example, the layer is formed with a thickness of 0.1-0.3 F (F: minimal feature size).

Layer 3 comprises a portion 31 which is located between the studs 1 and has a thickness (perpendicular to the substrate, i.e., to a surface of the hard mask layer 2) that is smaller than the height of the studs (measured from a surface of the hard mask layer 2 that faces the studs 1) such that studs 1 project above layer portion 31. However, in another embodiment the thickness of layer 3 exceeds the height of the studs. The layer portion 31 more specifically extends between sidewall portions 32 of layer 3 that cover the sidewalls 11 of the studs 1. The top portion of the studs 1 is covered by a top portion 33 of layer 3. In another embodiment the studs are created on layer 3, e.g., by depositing and structuring a stud layer on layer 3.

Referring to FIGS. 3A and 3B, implantation of layer 3 is performed in order to modify the etchability of layer 3, more particularly of longitudinal regions 312 of the layer portion 31 between the studs 1. As illustrated in FIGS. 3A, 3B, the implantation comprises a first implantation step which is carried out under a first direction of incidence (first implant direction). The first implant direction is tilted, i.e., it runs inclined with respect to a direction perpendicular to the layer portion 31 (i.e., to a surface normal of layer portion 31). Because of the tilted first direction of incidence a part of layer portion 3 is shadowed by the studs 1 with respect to the radiated particles such that the first stripe-like implanted regions 312 are generated in layer portion 31, wherein the implanted regions 312 are separated by non-implanted regions 313 located in the shadowed area of layer 3. In this embodiment ions are used as implanting particles. However, other kinds of particles can be employed such as non-charged atoms or molecules.

Further, the first direction of incidence has an azimuthal component (x-y-component, i.e., the component that lies in a plane parallel to layer portion 31) which is not zero but runs diagonally with respect to the stud column. In this embodiment the first component runs with a first angle of approximately 45 degrees with respect to the stud columns. Of course an embodiment of the invention is not restricted to a particular first angle, other values are possible. In another embodiment, the first angle depends on a particular crystal orientation of layer 3, e.g., a main crystal axis.

As a result of the non-zero azimuth of the first component, the distance between the middle of two neighboring implanted regions 312 (which extend diagonally with respect to the stud columns) is smaller than the distance between the center of two neighboring studs 1 of one column and row (which in FIG. 1B extend vertically and horizontally), respectively.

In order to enhance the implantation effect of the first implantation step, a further implantation step (third implantation step) is performed with an azimuthal component which is opposite to the azimuthal component of the first implantation direction, i.e., the azimuthal angle of the implant direction is rotated by 180°. In other words, the implant direction of the further implantation step has a component parallel to layer portion 31 running opposite to the first component of the first implantation direction, i.e., at an angle of 225 degrees with respect to the stud columns according to the first embodiment. Thus, the first and the further implantation step implant the same regions of layer portion 31. It is noted that the further implantation step is only optional.

After the first implantation and the further implantation step (if performed) the implanted stripes 312 in layer portion 31 are removed (e.g., by cold or hot wet etching). Then, a second layer 4 (e.g., of aluminum oxide) is deposited, wherein layer 4 covers the remaining layer portion 31 in the non-implanted regions 313 (where layer portion 31 is not removed) such that a double layer is present on the hard mask layer 2, whereas only a single layer (layer 4) is present in the region of the removed implanted regions 312.

Referring to FIGS. 4A and 4B, a second implantation step is performed with a second implantation direction (direction of incidence) which similarly to the first implantation step is inclined with respect to a direction perpendicular to layer portion 31 (tilted implantation). However, the second implantation direction has an azimuthal component that is essentially perpendicular to the azimuthal component of the first implantation direction, i.e., the second component has an angle of approximately 135 degrees with the stud columns according to the first embodiment.

Of course the azimuthal component of the second implant direction does not necessarily have to run perpendicular to the azimuthal component of the first component. An embodiment of the invention comprises other angles than 90 degrees between these components.

As a result of the second implantation step, second implanted regions (not shown) are formed in layer 4, wherein the second implanted regions extend longitudinally in the form of parallel stripes and perpendicular to the first implanted region 312 which were generated in layer portion 31. The second implanted regions thus cross the single layer region of layer 4 such that (rectangular) portions in the single layer region are implanted by the second implantation step. A further implantation step can be performed additionally to the second implantation step in order to increase the implantation dose in layer 4. For this, additional implantation with an implantation direction is chosen that has an azimuthal component that extends opposite to the azimuthal component of the second direction of incidence, i.e., at an angle of 315 degrees with respect to the stud columns according to this embodiment. However, the further implantation is optional and can be carried out, e.g., after the second implantation step or at the same time with the second implantation step (e.g., by using two ion sources).

The material of the second layer 4 is removed in the second implanted regions such that (rectangular) openings 315 are formed within the single layer region of the second layer 4. The openings 315 are arranged in a grid of parallel rows and columns which in the first embodiment is rotated by an angle of 45 degrees with respect to the stud columns and rows. In general, this angle depends on the twist of the first and second implantation direction with respect to the orientation of the stud columns.

A distance $d_1$ between two neighboring openings 315 of one row (or column) of the grid is smaller than the distance $d_2$ between two neighboring studs 1 of one stud row (or stud column). If the implantation twist (the angle at which the component parallel to layer 31 of the implantation direction extends with respect to the stud columns) is 45 degrees, this yields:

$$d_1 = \frac{d_2}{\sqrt{2}}.$$

Thus, dot like structures (the openings 315) result with a smaller pitch than the original stud structure. Since the openings 315 created in the second layer 4 provide access to the underlying hard mask layer 2, the hard mask layer 2 can be structured through the openings 315, e.g., in order to form contact areas with reduced pitch. Thus, the invention, e.g., allows generating structures with reduced pitch, wherein the structures can be arranged in a variety of patterns (depending on the stud layout). Examples are a regular square pattern as in the first embodiment or a checkerboard pattern.

The person skilled in the art will acknowledge that the use of aluminum oxide as the material of layer 3 and the second layer 4 is only exemplary. Other materials can be used in which a higher etchability relative to an etchant can be created by the implantation of ions. Examples of materials with an increased etch rate due to implantation are n-doped poly or amorphous silicon. See, e.g., "Doping and crystallographic effects in Cl-atom etching of silicon", Elmer, A Ogryzlo, Dale E. Ibbotson, Daniel L. Flamm and John A. Mucha, AT&T Bell Laboratories, Murray Hill, N.J. 07974.

Further, absolute rates for the intrinsic reaction between Cl atoms and surfaces of p-doped polycrystalline silicon, p-doped Si(100) and As, Sb-doped Si(111) substrates were measured for the first time as a function of dopant concentration ($N_e$) and substrate temperature in a downstream reaction system. This study clearly shows that when there is no ion bombardment, increasing $N_e$ increases the Si—Cl reaction rate even when silicon is lightly doped (~$10^{15}$ cm$^{-3}$), in contrast to in-discharge studies. E. A. Ogryzlo, Journal of Applied Physics, Mar. 15, 1990, Volume 67, Issue 6, pp. 3115-3120.

Further, the first and second layers 3, 4 can also be formed of a plurality of different layers or a separating layer can be deposited between the first and the second layer.

In a further example, heavy impactors such as Ar, Xe, Kr or F are used as implant species for the implantation of layer 3 and 4. However, other ions are also possible, e.g., hydrogen. For example, the implantation is carried out with implant doses between 5E14 and 5E16 1/cm$^2$. However, the applied dose is of course not restricted to that range but is chosen, e.g., dependent on the setup and the layer material.

Furthermore, it is noted that the figures only show a part of a structure (hard mask layer with studs) used in the manufacturing of a semiconductor device. Other parts of the semiconductor device might have the same pattern depicted here or might have different patterns. Furthermore, the patterns depicted above (and in the following embodiments) might be present in an intermediate state in the manufacturing of a semiconductor device or might be discernable in the final product.

It is further noted that instead of studs, different means can be employed in order to shadow layer 3 or 4 with respect to the first and second implantation direction, respectively. For example, an aperture which is separate to the substrate could be used. If studs on the substrate are used, the geometry of the studs does not have to be cylindrical. Other stud geometries can be used such as asymmetric geometries, rectangular (not square) or elliptical.

FIGS. 5A, 5B and 6A, 6B relate to a method in accordance with a second embodiment of the invention. As shown in FIGS. 5A (side view) and 5B (top view), a hard mask layer 2 is arranged on a substrate (not shown). On the hard mask layer 2 a plurality of structures in the form of studs 1 is arranged, the studs 1 forming a regular column and row pattern on hard mask layer 2 similar to the first embodiment. A layer 3 of, e.g., amorphous silicon is deposited such that a portion 33 covers the top section of the studs 1, a portion 32 covers sidewalls of the studs 1 and a portion 31 extends between the studs 1 and thus covers a section of the hard mask layer 2. The thickness of the layer depends on the height of the studs. In an example, a layer with a thickness of 0.1-0.3 F (F: minimal feature size) is used. Further, the distance d between two adjacent studs and the thickness t of layer 3 (which also covers the sidewalls of the studs with a thickness t) determines the width w of the implanted region. In this embodiment the width w of the implanted regions can be calculated from $w=\sqrt{2} \cdot d - 2 \cdot t$. For example the distance between neighborings studs is chosen such that the width of the implanted regions is above 0.3 F.

Layer portion 33 of layer 3 is removed from the studs 1 employing chemical mechanical polishing, CMP, wherein for stability reasons a sacrificial layer 5 is generated between the studs 1 as depicted in FIG. 6A. After the top portions 33 are removed from the studs the sacrificial material 5 is stripped.

Subsequently, a first implantation step with a first direction of incidence is performed, wherein the first direction of incidence has an azimuthal component (parallel to layer 3) which runs at an angle of 45 degrees with respect to the stud columns. Therefore, the first implantation step creates stripe like first implanted regions 312 in layer 3 in a region that is not shadowed with respect to the first direction of incidence by the studs 1. Again an angle of 45 degrees is only exemplary, other angles are also possible.

Further, a second implantation step with a second direction of incidence is performed, wherein the second direction of incidence has an azimuthal component which runs at an angle of 135 degrees with respect to the stud columns, i.e., perpendicular to the first component of the first implant direction. Therefore, second strip like implanted regions 314 are created in layer 3 (more particularly, in the portion 31 of layer 3 extending between the studs 1) such that the second implanted regions 314 run at an angle of nearly 90 degrees with respect to the first implanted regions 312.

As illustrated in FIG. 6B, both, the first and the second implanted regions 312, 314 extend with an angle of approximately 45 degrees with respect to columns in which the studs 1 are arranged. Located between neighboring studs, the first and second implanted regions 312 and 314 enclose a non-implanted region 313 which is neither implanted by the first implantation step nor implanted by the second implantation step. The non-implanted region 313 has a higher etchability with respect to an etchant compared to the implanted regions of layer 3. Therefore, in a subsequent etching step (e.g., by wet etching) the non-implanted regions 313 are removed in order to uncover the hard mask layer 2, whereas the implanted regions 312, 314 are not removed. In an example, B or $BF_2$ ions are used as implant species with high doses (e.g., 5E14-5E16 $1/cm^2$) and the etching of the implanted regions is performed with $NH_4OH$ or KOH, e.g., in an aqueous solution in the concentration range from 60 parts water to 1 part $NH_4OH$ to 10 parts water to 1 part $NH_4OH$ or beyond.

Furthermore, studs 1 are also removed using an appropriate etching step such that the hard mask layer 2 is uncovered also in the region of the studs. A grid of (essentially equally spaced) openings is thus created consisting of the openings in the region of the studs and in the regions of the non-implanted sections 313 of layer 3. The distance between two neighboring openings is half the distance of two neighboring studs of one stud column such that the generated grid of openings has only half the pitch as the studs 1 (i.e., the original structure) of the stud column.

It is noted that the first and the second implantation direction (first and second direction of incidence) is inclined with respect to a surface normal of hard mask layer 2 such that the studs actually shadow a region of layer 3 with respect to the first and second implant direction. In particular, the inclination angle (implantation angle) is chosen dependent on the height of the studs such that a shadow with respect to the first and second implantation direction is created which extends from the structure to a neighboring structure.

Further, as in the first embodiment, the first and the second implantation step can be completed by further implantation steps in order to enhance the implantation. For this, ions are implanted with a (third) implant direction which has an azimuthal component which runs opposite with respect to the azimuthal component of the first implantation step. Similarly, a (fourth) implantation step can be carried out enhancing the implantation of the second implantation step.

FIGS. 7A, 7B and 8A, 8B relate to a problem which can occur if implanted regions of a first layer are removed and a second layer is deposited that is implanted in a second implantation step, as in the first embodiment. As illustrated in FIGS. 7A and 8A, the shadowing structures (studs) are also implanted during implantation but, depending on the implantation angle, they are not completely implanted. Sidewalls 11 of the studs 1 are covered with a portion 32 of a layer 3 that is to be implanted. After a first and a further implantation step in order to create a first implantation region 312 (as describe above with respect to the first embodiment) an upper portion 12 of the studs 1 is also implanted, whereas a lower portion 13 is not implanted such that the etchability of the upper portion is higher than the etchability of the lower portion 13. When the first implanted regions 312 are removed the upper portion 12 (or at least a part of it) of the studs 1 is also removed which causes a deformation of the studs. This can lead to stud shadows with respect to the second implantation step with reduced accuracy.

Figure 9B:
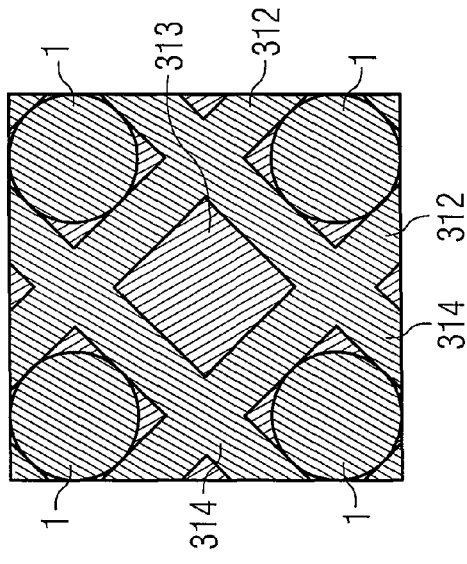

The problems emerging from a degradation of the stud geometry after the first implantation step can be avoided if no removal of implanted material is performed after the first implantation step, as in the second embodiment. FIGS. 9A to 12B refer to another (third) embodiment of the invention which does not comprise a removal of implanted material after the first implantation step. FIGS. 9A, 10A, 11A and 12A illustrate side views and FIGS. 9B, 10B, 11B and 12B top views of the structure, As depicted in FIGS. 9A and 9B, a plurality of structures in the form of cylindrical studs 1 is formed on a hard mask layer 2. Similar to the first embodiment a layer 3 (e.g., of aluminum oxide) is deposited comprising a portion 31 which covers the hard mask layer 2 in a region between the studs 1. Another portion 32 of layer 3 covers sidewalls 11 of the studs 1.

A first implantation is performed including a first implantation step at an angle of 45 degrees and a further (third) implantation step at an angle of 315 degrees (i.e., with an opposite azimuthal component) for enhancing the implantation as in the first embodiment. The (first) implantation direction of the first implantation step has an azimuthal component (i.e., parallel to the substrate and parallel to hard mask layer 2, respectively) which runs at an angle of 45 degrees with respect to columns in which the studs 1 are arranged. After the first implantation step and the further (optional) implantation step a second implantation is performed in turn including a second implantation step and an enhancing further implantation step, the second implantation step and the further implantation step having opposite azimuthal components.

Figure 10A:
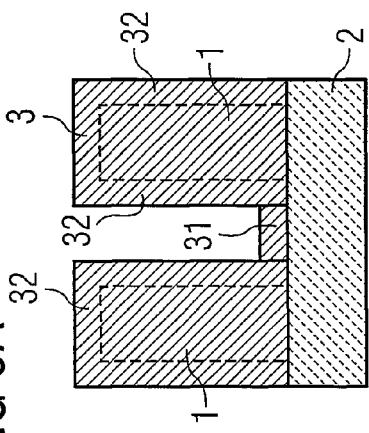
Figure 10B:
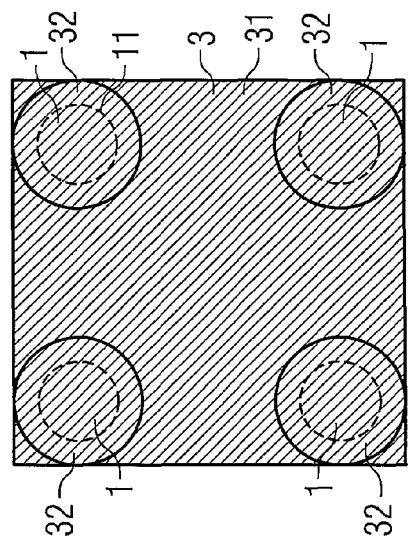
Figure 13A:
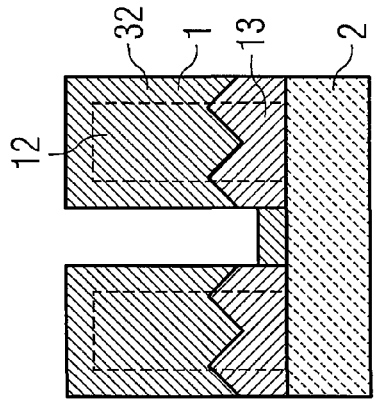
FIGS. 13A-16B illustrate process steps of a method according to a fourth embodiment of the invention.
Figure 14A:
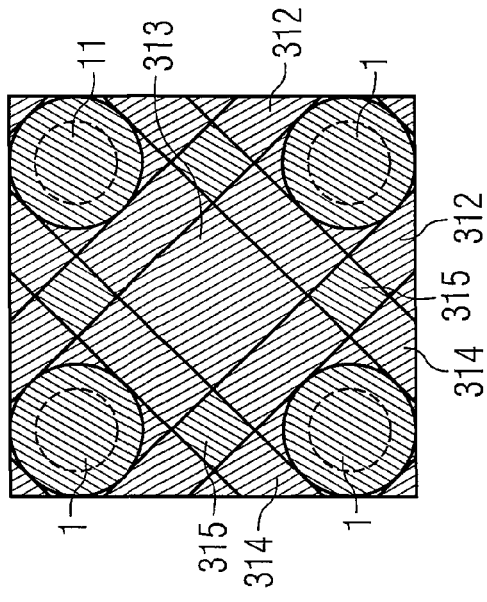
Figure 13B:
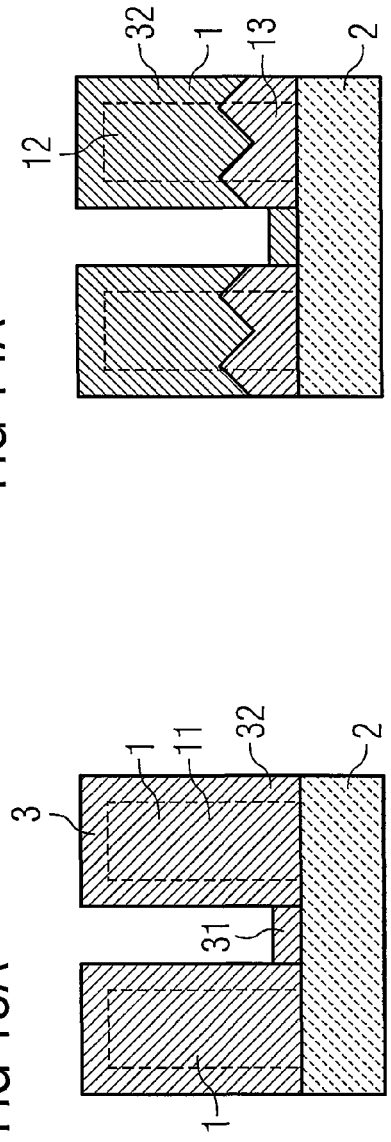
Figure 14B:
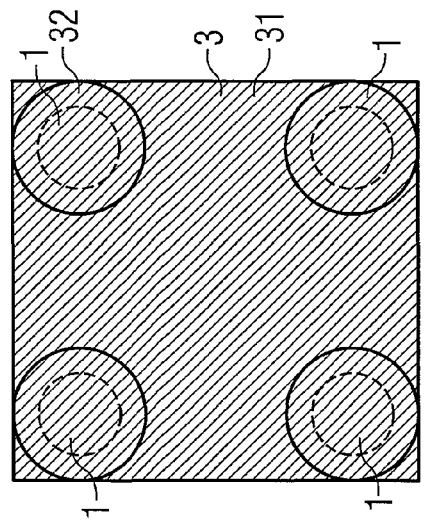

The result of the implantation is illustrated in FIGS. 10A and 10B, wherein FIG. 10A illustrates the arrangement of FIG. 10B viewed along the first implant direction (along a viewing direction V diagonal to the stud columns). First longitudinal implantation regions 312 (created by the first implantation) extend essentially parallel to one another and cross second implantation regions 314 (created by the second implantation) at an angle of about 90 degrees. The first and second implanted regions 312, 314 enclose a rectangular shaped non-implanted region 313. A top part 12 of the studs 1 is also implanted such that after removing the implanted regions 312, 314 also the top portion 12 of the sidewall section 32 of layer 3 is removed from studs 1 as depicted in FIG. 11a.

After removing (stripping) the implanted regions 312, 314 of layer 3 stripe-like openings 3120, 3140 are formed in layer 3 as illustrated in FIG. 11B. The openings 3120, 3140 uncover a region of the underlying hard mask layer 2. The hard mask layer 2 is etched via the openings 3120, 3140 in order to form line-like structures 212, 214 in layer 2 permitting access to a layer (not shown) below the hard mask layer 2, e.g., a contact layer or active area regions of a device.

A fourth embodiment of the invention is illustrated in FIGS. 13A to 16B. Again, a regular pattern of studs 1 is produced on a hard mask layer 2. Subsequently, a layer 3 of material with an etchability (i.e., its etch rate) with respect to an etchant that is reduced upon implantation, e.g., aluminum oxide, is deposited. Further, as in the previous embodiments, crosswise implantation is used in order to generate first and second line-like implantation regions 312, 314. The implanted regions 312, 314 enclose a non-implanted region 313 located in a region that was shadowed by the studs 1 both with respect to the first implant direction and the second implant direction.

Further, both the first and the second implanted regions 312, 314 are implanted twice from opposite directions (wherein the term "opposite direction" again refers to the azimuthal components). The first and second implanted stripes 312, 314 overlap such that overlapping regions 315 are formed which were implanted four times (twice by a first implantation including a first implantation step and an enhancing further (third) implantation and twice by a second implantation including a second implantation step and a further (fourth) enhancing implantation step).

A removal step is performed in order to only remove material of layer 3 outside of the overlapping regions 315. This can be done by using an etch process that removes the non-implanted and the double-implanted regions but does not remove the overlapping regions 315 which were implanted four times. For this, an etch step (e.g., dry etch) with a suited (linear or non-linear) contrast curve is applied. Examples of contrast curves of different etching means are given in FIGS. 24A, 24B and 25A, 25B.

Figure 16A:
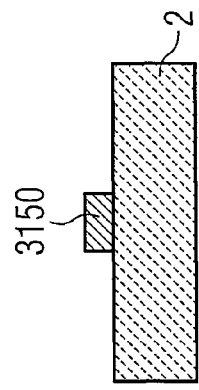
Figure 16B:
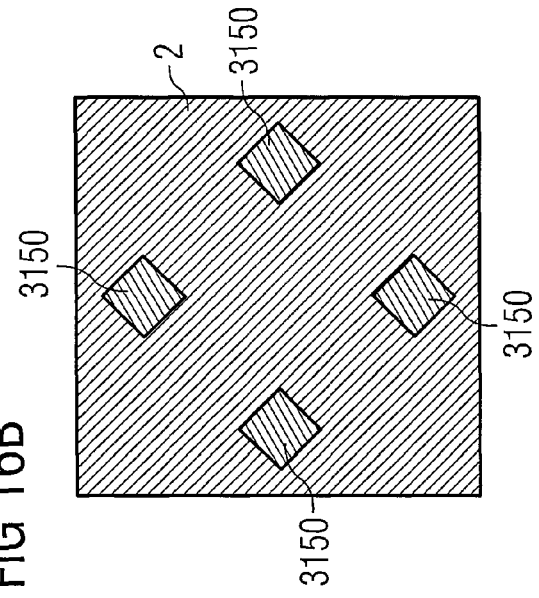
Figure 15A:
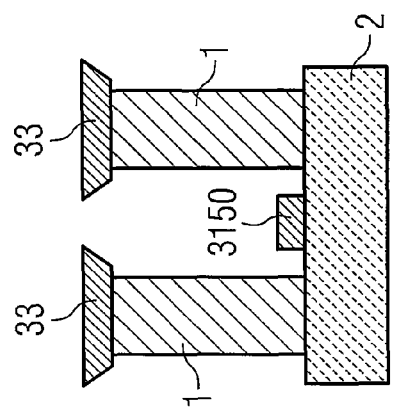
Figure 15B:
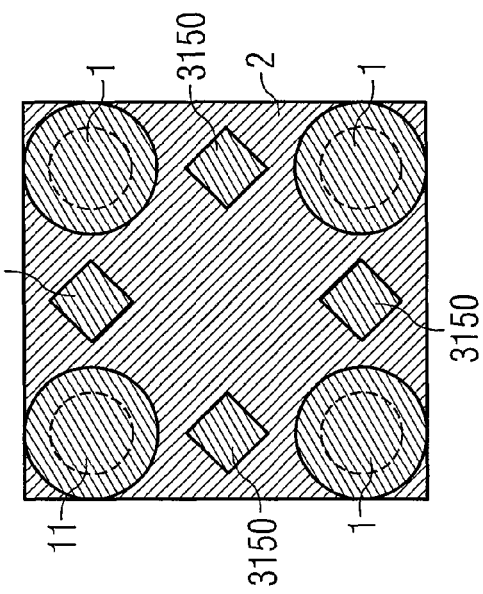
Figure 17A:
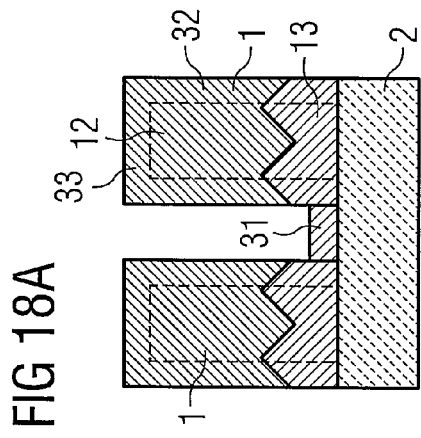
Figure 18A:
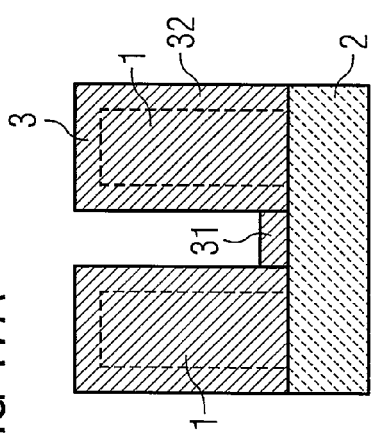
Figure 17B:
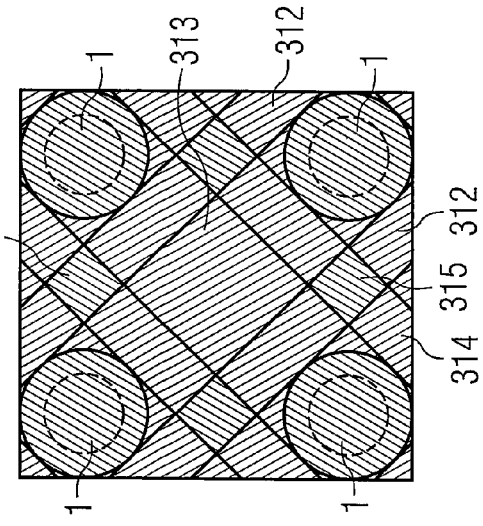
Figure 18B:
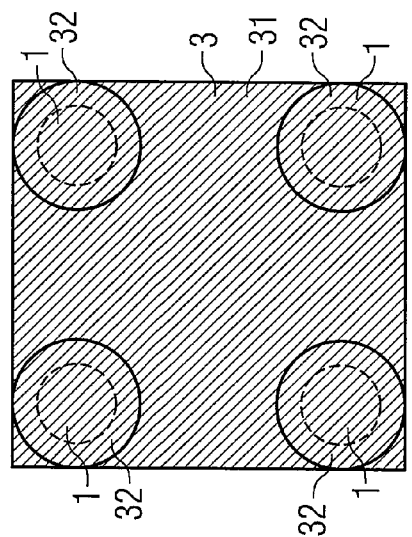

The result of the removal step is shown in FIGS. 15A and 15B. Only the overlapping regions 315 were not removed such that pads 3150 on the underlying hard mask layer 2 are formed. Sidewall portions 32 of layer 3 covering the sidewalls of the studs 1 were equally removed during the removal step (see FIG. 15A), whereas the four times implanted top portions 33 of layer 3 are not removed. Therefore, in a subsequent etching step the studs 1 are removed, thereby lifting the top sections 33 of layer 3. The resulting final structure is shown in FIGS. 16A and 16B: Only the pads 3150 remain on the hard mask layer 2.

A fifth embodiment of the invention which also avoids the deposition of a second material layer is illustrated in FIGS. 17A to 20B. As in the previous embodiments a plurality of cylindrical studs 1 is formed on hard mask layer 2 and a layer 3 is deposited, wherein the layer comprises a material whose etchability can be raised by implantation (e.g., aluminum oxide).

The studs are arranged within essentially parallel columns and ions are implanted with a first implantation step at an angle of 45 and with a further implantation step 225 degrees with respect to the stud columns producing first implantation regions 312 within layer 3. Further, layer 3 is implanted with a second implantation step at an angle of 135 and an additional implantation step at an angle of 315 degrees with respect to the stud columns such that second implanted regions 314 are produced that run perpendicular to the first implanted stripe-like regions 312. The first implanted regions 312 overlap with the second implanted regions 314 and thus overlapping regions 315 are formed, wherein the overlapping regions 315 have been implanted four times.

Applying an appropriate etching step (e.g., wet etch) only the four times implanted overlapping regions 315 are removed such that openings 3150 are created and the hard mask layer 2 is uncovered only within the overlapping regions 315. The region of layer outside the overlapping regions 315 (i.e., regions of layer 3 which are not implanted or which are only implanted twice) are not removed. The etching step also removes top portion 33 of layer 3 which were covering the top of studs 1. This is shown in FIG. 19A.

Subsequently, the hard mask layer 2 is etched in the uncovered regions 315 such that openings 215 are generated in the hard mask layer 2 which in particular can be formed as through-openings to a layer below the hard mask layer 2 or the substrate. The resulting hard mask structure with reduced pitch is shown in FIG. 20B.

Figure 21A:
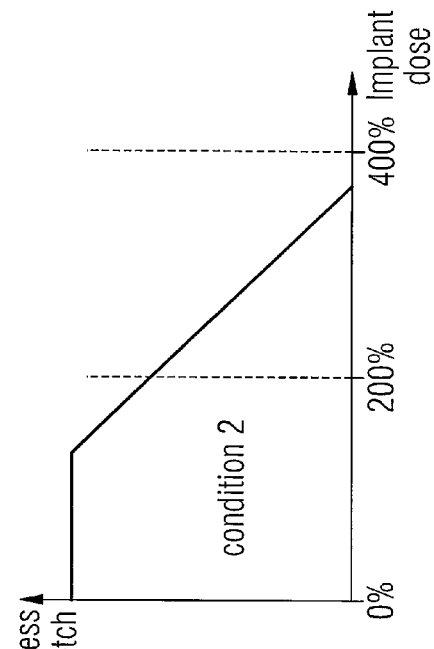
FIGS. 21A-22B illustrate contrast curves of different etching means.
Figure 21B:
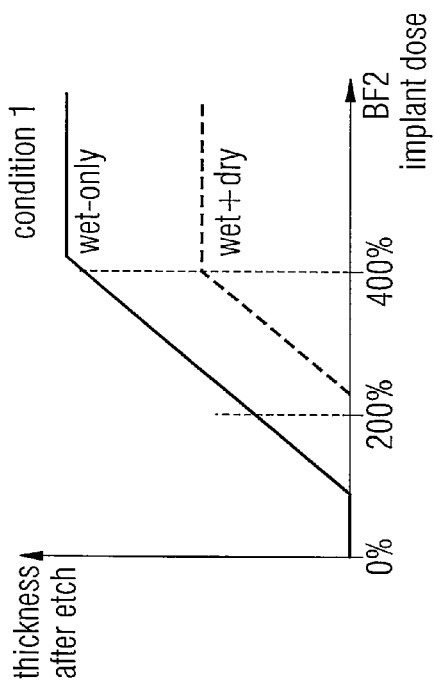

FIGS. 21A and 21B schematically illustrate the etching behavior (contrast curves) of etching means relative to a layer of amorphous silicon. However, amorphous silicon is only one example of a material whose etchability can be reduced by implantation. Other materials with a similar behavior are known to a skilled person.

Referring to FIG. 21A, the material thickness that is removed by the etching means (y-axis) depends on the amount of implanted ions ($BF_2$ implant dose—x-axis, in relative units). Two different etching means, wet only etchant (upper curve) and a combination of wet and dry etching (lower curve), are contemplated at first etching conditions (e.g., time of action, temperature). With respect to the wet only etchant, no etching occurs if the implant dose exceeds a certain dose (at approximately 380% in this schematic). If an implant dose below 100% is chosen the material layer is completely removed. As to the wet and dry etching curve, the layer is completely removed if the implant dose is below approximately 220%. Thus, combining a dry etch step with the wet etch enhances the contrast and may improve the etching, e.g., with respect to the fourth embodiment which requires non-implanted and twice implanted regions to be removed whereas four times implanted regions shall not be removed.

The behavior of the etching means of FIG. 21B at a second etching condition different from the first etching condition is illustrated in FIG. 21B. The wet-only curve has a reduced slope compared to the wet only curve of the first etching condition (FIG. 21A). It is noted that the behavior (the contrast curves) of the etching means illustrated in FIGS. 21A and 21B is only exemplary. Other etching means are available and can have different contrast curves, e.g., with an exponential characteristic.

Figure 22A:
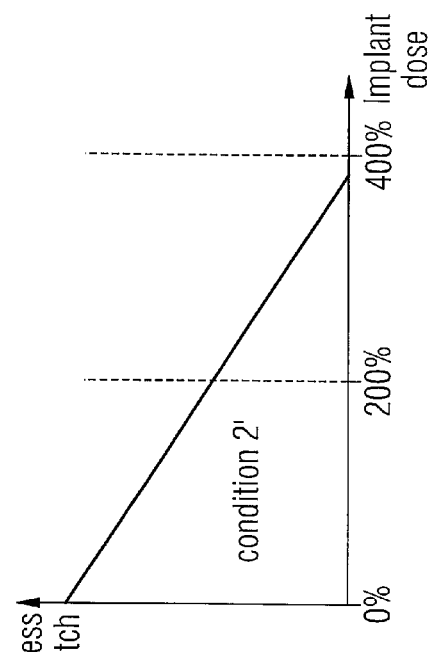
Figure 22B:
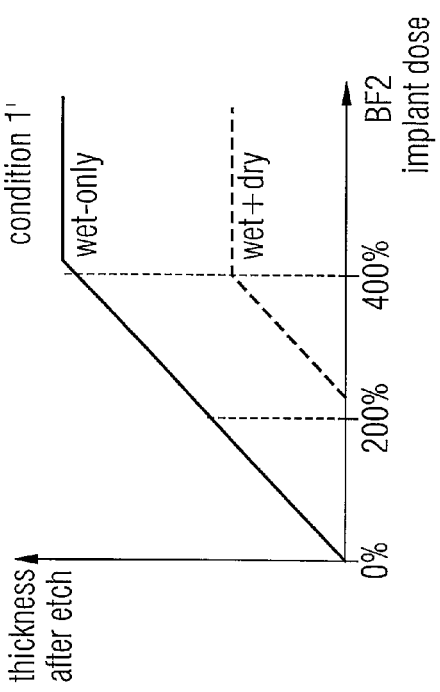
Figure 23A:
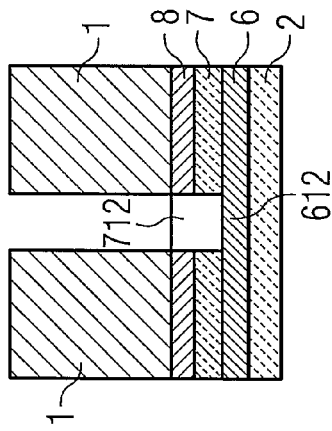
Figure 23B:
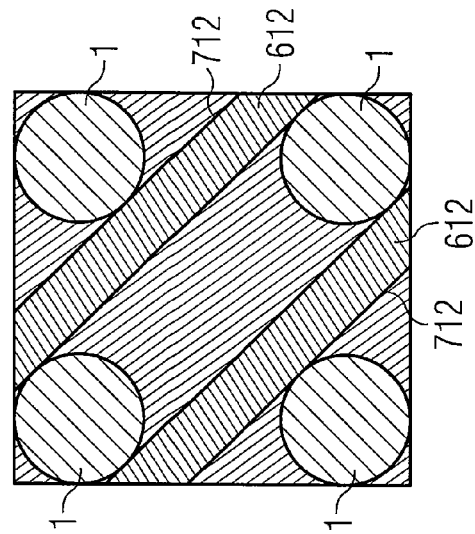

The schematic contrast curves shown in FIGS. 22A and 22B refer to etchant for etching an aluminum oxide layer. This material, however, is only shown as an example of a material which can have a higher etchability in the implanted state. The higher the amount of implanted ions (x-axis) the higher is the etchability of the material, i.e., the remaining layer thickness after the etch (y-axis). A first contrast curve for first etching conditions (labelled "conditions 2") are shown in FIG. 22A. Below an offset an implant dose of about 150 percent no material is etched. Above 150% the etchabilty increases with a linear contrast curve. A linear contrast curve, however, is only an example, other characteristics are possible.

FIG. 22B shows a contrast curve for the same etching means as in FIG. 22A but under different etching conditions (labelled "conditions 2"). The contrast curve does not show any offset such that material is etched as soon as an amount of implanted ions is present.

A method according to a sixth embodiment of the invention is illustrated in FIGS. 23A-26B. As in the other embodiments, a hard mask layer 2 is deposited on a substrate. Different from the other embodiments, an additional layer stack comprising further hard mask layers 6, 7 and 8 is generated over the hard mask layer 2, layer 7 being arranged between layer 6 and top layer 8. Shadowing structures in the form of studs 1 are generated on the top layer 8 of the layer stack. Layers 6 and 8 can be formed, e.g., of aluminum oxide, whereas layer 7 can be formed of, e.g., silicon oxide. The studs 1 can be formed of, e.g., carbon that, for example, is produced by an over-etch or an over-exposure process (e.g., CD trim by lithography or by etching).

Figure 24A:
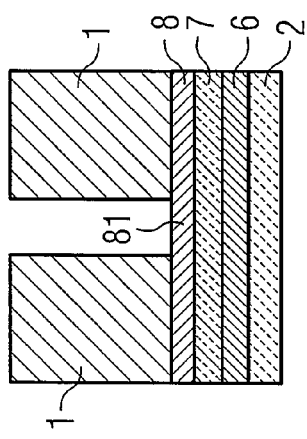
Figure 24B:
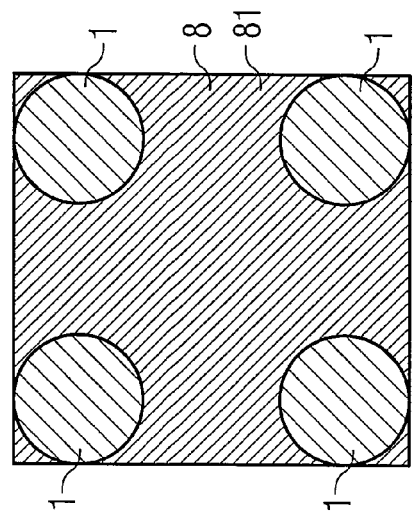

A portion 81 of top layer 8 extends in a region between the studs 1 and is partially implanted by a first implantation step using tilted ion implantation (as in the other embodiments) in order to produce first line-like implantation regions within portion 81. The material of layer 8 is removed in the first implanted regions such that layer 7 is uncovered which is subsequently removed by an etching step (e.g., dry etching). The situation after the etching of layer 7 is shown in FIGS. 24A and 24B. As illustrated in FIG. 24A, recesses 712 are formed in layer 7 uncovering regions 612 of layer 6 which is located between hard mask layer 2 and layer 7.

A second implantation is performed with an implant direction component parallel to the substrate (x-y-component) which is perpendicular to the x-y-component of the first implant direction such that second stripe-like implanted regions are formed that overlap with the uncovered regions 615 of layer 6 such that regions of layer 8 and rectangular regions 615 of layer 6 are implanted. The implanted material is removed, i.e., the second implanted regions 814 of layer 8 and the implanted region 615 of layer 6 are removed. Thus, openings 6150 are formed in layer 6 permitting the lower hard mask layer 2 to be etched in the region of the openings 6150 and form through opening in hard mask layer 2. Further, the remaining layer 6, 7, 8 as well as studs 1 are be removed. As a result, only the hard mask layer 2 remains comprising a regular pattern of rectangularly formed openings 215. This is shown in FIGS. 26A and 26B.

Figure 27:
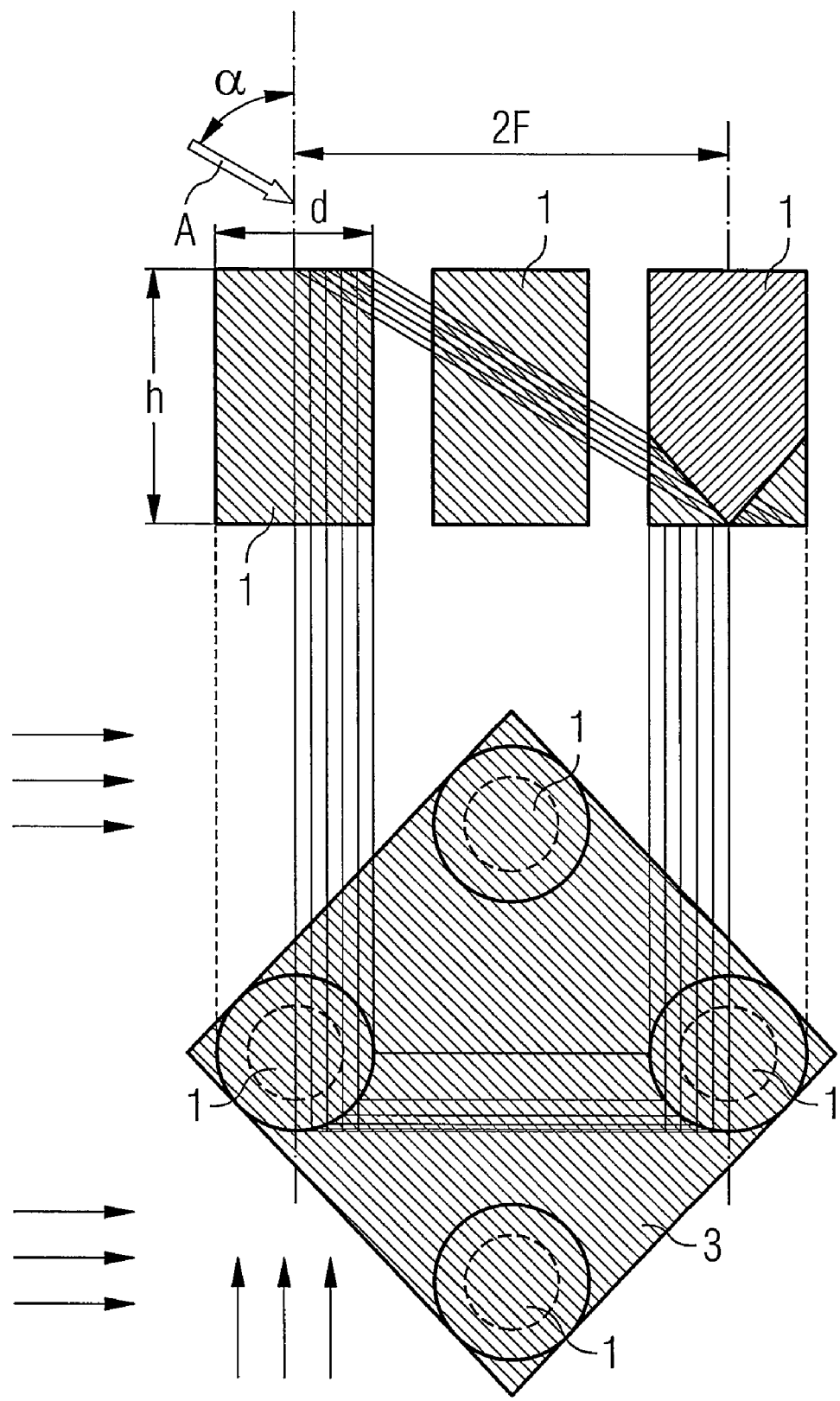
FIG. 27 illustrates the relationship between implantation angle and structure height with respect to circular studs.

FIG. 27 illustrates the relationship between the height of circularly formed vertical studs 1 and the implantation angle $\alpha$ of an ion implantation step. Ions are radiated towards a layer 3 at the implantation angle $\alpha$ during implantation, i.e., the direction of incidence A runs inclined at the angle $\alpha$ with respect to a direction perpendicular to the layer 3 (the vertical direction in FIG. 27).

In an embodiment the angle $\alpha$ is chosen dependent on the height h of the structures such that a shadow created by one of the structures with respect to the implant direction extends from the structure to a next neighboring structure in the implant direction. The implantation direction A has a component which runs parallel to the layer 3 (i.e., parallel to the x-y-plane). A "next neighboring structure in the implant direction" of a structure is a structure that adjoins the structure along the direction of the x-y-component of the implant direction A (the horizontal, diagonal direction in FIG. 27). Assuming a distance between the centers of two neighboring studs 1 of 2 F (F: minimum feature size) the implantation angle has to satisfy tan $\alpha$=2 F/h in order to create a shadow reaching from one structure to a neighboring structure, i.e., in order to create overlapping shadows in the implant direction (more precisely, in the direction of x-y-component of the implant direction).

For example, if the implant angle is limited to maximal 45 degrees, the minimal height of the studs is 2 F for creating overlapping shadows. If the limit is 20 degrees the minimal height is 5.5 F. However, other parameters can be taken into account for choosing the implant angle such as the aspect ratio of the studs, the critical dimensions of the studs, the final critical dimensions desired and the recoil behavior of the implant. Further, variations of the stud profile angles can be considered.

Figure 28:
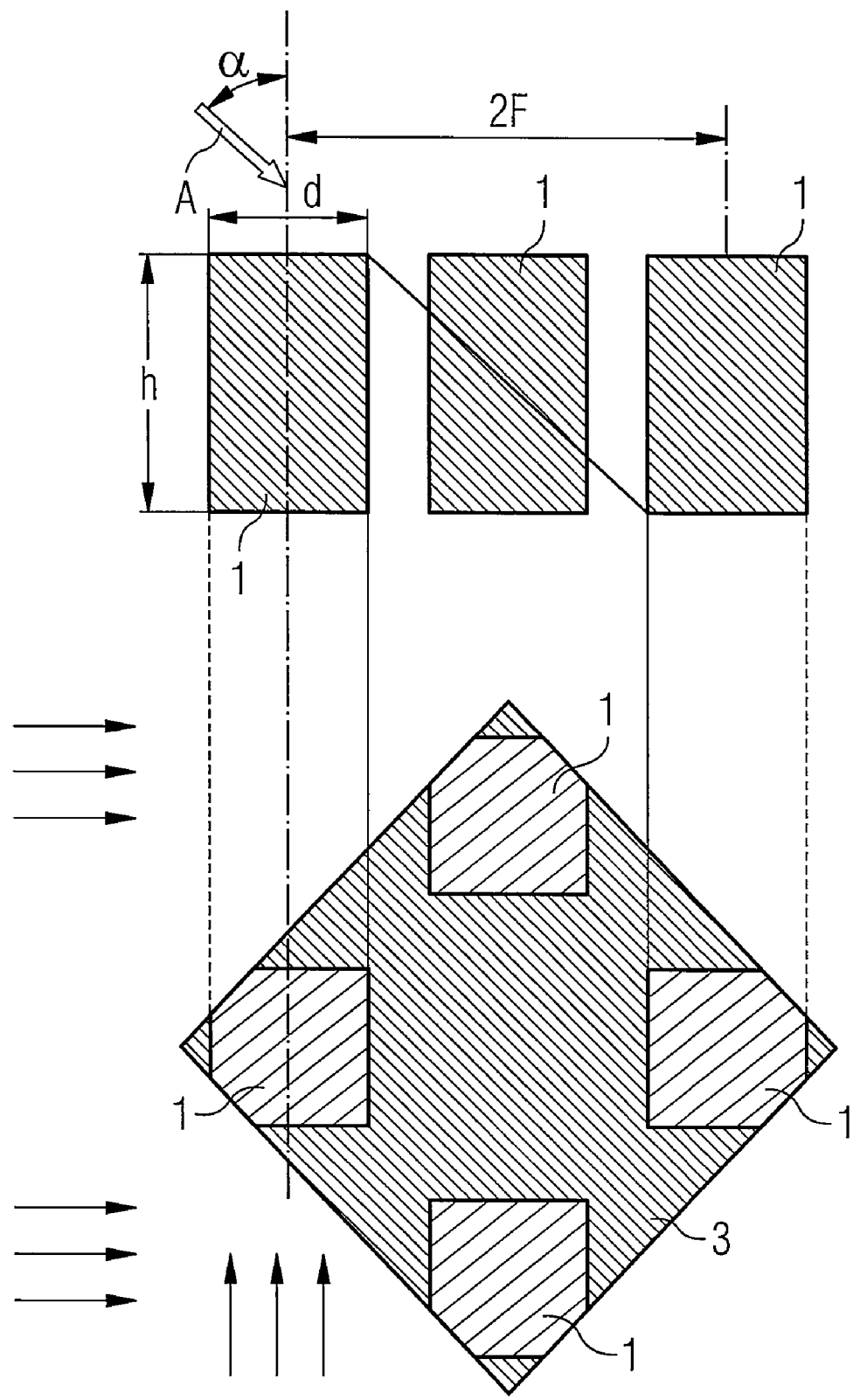
FIG. 28 illustrates the relationship between implantation angle and structure height with respect to square studs.

The situation in the case of square studs is illustrated in FIG. 28. Again, a diagonal distance of 2 F between two neighboring studs (in a direction of the x-y-plane component of the implant direction) is considered. In that case, an implant angle $\alpha$ can be calculated from tan $\alpha$=(2 F−D)/h that is required in order to generate overlapping shadows. For example, if the implant angle $\alpha$ is limited to maximal 45 degrees and the widths of the square studs is F/2 a minimal height of the studs of 1.5 F results. If the limit of the implant angle is at 20 degrees the minimal height of the studs is 4.1 F.

As further is illustrated in FIG. 28, the distance between two stud columns is 2 F*$\sqrt{2}$ if the distance between neighboring studs is 2 F.

As discussed above, the present invention provides a number of inventive embodiments. In one embodiment, an integrated circuit is fabricated by performing first and second implantation steps, in either order. In the first implantation step, particles are implanted into a layer under a first direction of incidence and, in the second implantation step, particles are implanted into the layer under a second direction of incidence that is different from the first direction of incidence. The layer, which can have a thickness in the range of approximately 0.1 to approximately 0.3 F as an example, is then partially removed depending on a local implant dose generated by the first and the second implantation step.

In one embodiment, the second direction of incidence is chosen to have an azimuthal component that runs obliquely relative to an azimuthal component of the first direction of incidence. For example, the azimuthal component of the second direction of incidence can be perpendicular to the azimuthal component of the first direction of incidence. In another embodiment, the first and the second direction of incidence both have a tilt angle with respect to the layer that is smaller than 45 degrees.

In a variation, a plurality of structures is provided which shadow a region of the layer with respect to the first and the second direction of incidence. For example, first implanted regions can be created in the region of the layer that is not shadowed by the structures with respect to the first direction of incidence and second implanted regions can be created in the region of the layer that is not shadowed by the structures with respect to the second direction of incidence. In one case, the first and/or the second implanted regions extend longitudinally, e.g., the first implanted regions run at an angle relative to the second implanted regions.

In another example, the layer is removed within the overlapping regions so that openings are created within the overlapping regions. The layer comprising the openings can be used as a hard mask for structuring at least one further layer.

In another embodiment, the structures are arranged in a regular pattern, wherein in a Cartesian pattern the structures are arranged in a plurality of essentially parallel columns and rows and wherein the azimuthal components of the first and the second direction of incidence run at an angle relative to the columns. For example, the structures can be arranged in a Cartesian or in a hexagonal pattern. In another example, neighboring structures cab have a center to center pitch of approximately 2 F. In yet another example, the azimuthal components can run at an angle of approximately 45 degrees relative to the columns.

In another embodiment, the layer is deposited conformally such that the structures are also covered by the layer. The layer includes sidewall portions that each cover a sidewall of the structures. The thickness of the layer can be chosen dependent on the distance between neighboring structures such that projections of the sidewall portions of the neighboring structures do not overlap with respect to the first and/or second direction of incidence. For example, the layer can be removed from the structures before the first and the second implantation step.

In another embodiment, the layer comprises a material that has a lower etchabilty relative to an etchant in the implanted state than in the non-implanted state. In one example, the layer comprises at least one of a group comprising amorphous silicon, polysilicon and a polysilicon/SiON stack. In this case, the removal step can be performed using an etchant containing $NH_4OH$ or KOH and/or the implanted particles can be boron ions.

Another embodiment of fabricating an integrated circuit includes performing a first implantation step, wherein particles are implanted into a first layer under a first direction of incidence and performing a first removal step, wherein the first layer is partially removed depending on a local implant dose generated by the first implantation step. A second implantation step can be performed to that particles are implanted into a second layer under a second direction of incidence and a second removal step can be performed so that the second layer is partially removed depending on the local implant dose generated by the second implantation step.

In one embodiment, the first implanted regions are created in a region of the first layer that is not shadowed by the structures with respect to the first direction of incidence and second implanted regions are created in a region of the second layer that is not shadowed by the structures with respect to the second direction of incidence. In this case, the first removal step comprises removing the first implanted regions and/or the second removal step comprises removing the second implanted regions.

In yet another embodiment, an arrangement is provided for generating an integrated circuit. A layer is disposed on a substrate and includes a plurality of first implanted regions and a plurality of second implanted regions that run at an angle relative to the first implanted regions. A plurality of structures can also be included, wherein the first and the second implanted regions extend between the structures. For example, the structures can be arranged in a regular pattern. As another example, the structures can be columnarly shaped and/or have a circular or a rectangular cross section.

What is claimed is:

1. A method of fabricating an integrated circuit, the method comprising:
   providing at least one layer over a workpiece having active area regions disposed on a top surface;
   performing a first implantation step, wherein particles are implanted into the at least one layer under a first direction of incidence;
   performing a second implantation step, wherein particles are implanted into the at least one layer under a second direction of incidence that is different from the first direction of incidence, wherein on a plane parallel to the top surface of the workpiece, the azimuthal component of the first direction and the azimuthal component of the second direction are not along a same line; and
   partially removing the at least one layer such that the at least one layer is partially removed depending on a local implant dose generated by the first implantation step and the second implantation step.

2. The method according to claim 1, wherein partially removing the at least one layer comprises removing non-implanted regions that are neither implanted by the first implantation step nor by the second implantation step.

3. The method according to claim 1, wherein partially removing the at least one layer comprises removing implanted regions of the at least one layer.

4. The method according to claim 1, wherein a plurality of structures disposed over the workpiece shadow a region of the at least one layer along the first direction of incidence and the second direction of incidence.

5. The method according to claim 4, wherein,
   first implanted regions are created in the region of the at least one layer that is not shadowed by the structures with respect to the first direction of incidence; and
   second implanted regions are created in the region of the at least one layer that is not shadowed by the structures with respect to the second direction of incidence.

6. The method according to claim 5, wherein the first implanted regions overlap with the second implanted regions such that overlapping regions are created that are implanted by the first implantation step and the second implantation step.

7. The method according to claim 6, wherein the at least one layer is removed outside the overlapping regions.

8. The method according to claim 6, wherein after partially removing the at least one layer the thickness of the at least one layer is smaller within the overlapping regions than outside of the overlapping regions.

9. The method according to claim 6, wherein the at least one layer is removed within the overlapping regions such that openings are creating within the overlapping regions.

10. The method according to claim 4, wherein the tilt angle of the first direction of incidence and the second direction of incidence is chosen such that at least one of the structures casts a shadow which extends from the structure to at least a next neighbored structure in order to create a non-implanted region that extends from the structure to a neighboring structure.

11. The method according to claim 4, wherein the structures have essentially a same height.

12. The method according to claim 4, wherein the structures have a circular or a rectangular cross section.

13. The method according to claim 4, wherein the at least one layer is deposited conformally such that the structures are also covered by the at least one layer, the at least one layer comprising sidewall portions that each cover a sidewall of the structures.

14. The method according to claim 13, wherein the thickness of the at least one layer is chosen dependent on the distance between neighboring structures such that projections of the sidewall portions of the neighboring structures do not overlap with respect to the first and/or second direction of incidence.

15. The method according to claim 1, further comprising:
    performing a third implantation step with a third direction of incidence; and performing a fourth implantation step with a fourth direction of incidence, wherein the azimuthal component of the third direction of incidence runs opposite to the azimuthal component of the first direction of incidence and the azimuthal component of the fourth direction of incidence runs opposite to the azimuthal component of the second direction of incidence.

16. The method according to claim 15, wherein the third implantation step is performed after the first implantation step but before the second implantation step and the fourth implantation step is performed after the second implantation step.

17. The method according to claim 1, wherein the at least one layer comprises a material that has a higher etchabilty relative to an etchant in an implanted state than in a non-implanted state.

18. The method according to claim 17, wherein the at least one layer comprises aluminum oxide.

19. The method according to claim 18, wherein a removal step comprises using an etchant containing H2O2-NH4OH.

20. The method according to claim 18, wherein the implanted particles comprise ions of a noble gas.

21. The method according to claim 17, wherein the implanted particles comprise F and/or H.

22. The method according to claim 1, wherein the at least one layer comprises a material that has a lower etchabilty relative to an etchant in the implanted state than in the non-implanted state.

23. The method according to claim 22, wherein the at least one layer comprises at least one of a group comprising amorphous silicon, polysilicon and a polysilicon/SiON stack.

24. The method according to claim 4, wherein the plurality of structures are disposed adjacent to the at least one layer.

25. A method of fabricating an integrated circuit, the method comprising:

forming a plurality of structures over a hard mask layer, the plurality of structures covering a first portion of the hard mask layer and exposing a remaining portion of the hard mask layer, the plurality of structures being arranged in rows along a first reference direction and along columns along a second reference direction, the first and the second reference directions being disposed on a reference plane;

forming a layer over the hard mask layer and the plurality of structures, a first portion of the layer covering the exposed remaining portion of the hard mask layer;

forming a first implanted region in the first portion of the layer by implanting at a first direction having a first azimuthal angle on the reference plane, wherein the first azimuthal angle is an acute angle along a clockwise direction from the first reference direction;

forming a second implanted region in the first portion of the layer by implanting at a second direction having a second azimuthal angle on the reference plane, wherein the second azimuthal angle is an acute angle along a counter-clockwise direction from the first reference direction; and partially removing the first implanted region and the second implanted region depending on the local implant dose within the first and the second implanted regions.

26. The method of claim 25, wherein the first azimuthal angle and the second azimuthal angle are symmetric along a mirror plane comprising the first reference direction.

27. The method of claim 25, wherein the first azimuthal angle is about 45 degrees from the first reference direction along the clockwise direction, and wherein the second azimuthal angle is about 45 degrees from the first reference direction along the counter-clockwise direction.

28. The method of claim 25, further comprising using the plurality of structures to form an unimplanted region when forming the first and the second implantation regions by implanting at the first and the second directions.

29. The method of claim 25, further comprising implanting at a third direction having a third azimuthal angle on the reference plane while forming the first implanted region, and implanting a fourth direction having a fourth azimuthal angle on the reference plane while forming the second implanted region, the third azimuthal angle being opposite the first azimuthal angle, and the fourth azimuthal angle being opposite the second azimuthal angle.

30. The method of claim 25, wherein the first implanted region is oriented along the first azimuthal angle, and wherein the second implanted region is oriented along the second azimuthal angle.

* * * * *